(12) United States Patent
Hashimoto

(10) Patent No.: US 6,340,606 B1
(45) Date of Patent: Jan. 22, 2002

(54) SEMICONDUCTOR DEVICE AND METHOD OF MANUFACTURING THE SAME, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/589,353

(22) Filed: Jun. 8, 2000

Related U.S. Application Data

(62) Division of application No. 09/271,336, filed on Mar. 18, 1999, now Pat. No. 6,097,610.

(30) Foreign Application Priority Data

Mar. 27, 1998 (JP) ............................................. 10-100580
Feb. 19, 1999 (JP) ............................................. 11-41119

(51) Int. Cl.[7] ........................ H01L 21/44; H01L 21/48; H01L 21/50
(52) U.S. Cl. ........................ 438/106; 438/15; 438/108; 438/123; 257/778; 257/780; 257/786; 361/772; 361/774; 361/779; 361/760
(58) Field of Search ........................ 438/15, 110, 123, 438/125, 618, 666, 106, 108; 257/778, 780, 786, 730; 361/772, 774, 779, 760

(56) References Cited

U.S. PATENT DOCUMENTS

| | | | |
|---|---|---|---|
| 5,019,944 A | 5/1991 | Ishii et al. | 361/783 |
| 5,286,417 A | 2/1994 | Mahmoud et al. | 252/519.33 |
| 5,431,571 A | 7/1995 | Hanrahan et al. | 439/91 |
| 5,506,514 A | 4/1996 | Difrancesco | 324/757 |
| 5,624,268 A | 4/1997 | Maeda et al. | 439/66 |
| 5,628,919 A | 5/1997 | Tomura et al. | 216/18 |
| 5,766,982 A | 6/1998 | Akram et al. | 438/51 |
| 5,805,425 A | 8/1998 | Peterson | 361/769 |
| 5,936,848 A | 8/1999 | Mehr et al. | 361/777 |
| 6,011,312 A | 1/2000 | Nakazawa et al. | 257/778 |
| 6,011,694 A * | 1/2000 | Hirakawa | 361/774 |

FOREIGN PATENT DOCUMENTS

| | | |
|---|---|---|
| EP | 0 704 899 A2 | 4/1996 |
| JP | 62-52953 | 3/1987 |
| JP | 9-51018 | 2/1997 |
| JP | 9-199632 | 7/1997 |
| JP | 9-266231 | 10/1997 |
| JP | 9-298252 | 11/1997 |

OTHER PUBLICATIONS

XP 000851211; "New Chip Scale Package with CTE Matching to the Board"; R.D. Schueller; Oct. 13, 1997; pp. 205–215.
XP 000624972; "Simple-Structure, Generally Applicable Chip-Scale Package"; Matsuda et al.; May 21, 1995; pp. 218–223.

* cited by examiner

*Primary Examiner*—Charles Bowers
*Assistant Examiner*—Hsien-Ming Lee
(74) *Attorney, Agent, or Firm*—Oliff & Berridge, PLC

(57) ABSTRACT

The semiconductor device comprises an insulating film in which penetrating holes are formed, a semiconductor chip having electrodes, a wiring pattern adhered by an adhesive over a region including penetrating holes on one side of the insulating film and electrically connected to the electrodes of the semiconductor chip, and external electrodes provided on the wiring pattern through the penetrating holes and projecting from the surface opposite to the surface of the substrate on which the wiring pattern is formed. Part of the adhesive is drawn in to be interposed between the penetrating holes and external electrodes.

22 Claims, 11 Drawing Sheets

$\phi \leqq d$

SEMICONDUCTOR DEVICE AND METHOD OF MANUFACTURING THE SAME, CIRCUIT BOARD, AND ELECTRONIC INSTRUMENT

This is a Division of application Ser. No. 09/271,336 filed Mar. 18, 1999, now U.S. Pat. No. 6,097,610. The entire disclosure of the prior application is hereby incorporated by reference herein in its entirety.

BACKGROUND OF THE INVENTION

1. Field of the Invention

The present invention relates to a semiconductor device and method of manufacture thereof, a circuit board, and an electronic instrument.

2. Description of Related Art

With the recent increasingly compact nature of electronic instruments, there is a demand for semiconductor device packages appropriate for high-density mounting. In response to this, surface-mounted packages have been developed, such as Ball Grid Array (BGA) and Chip Scale/Size Package (CSP). With such surface-mounted packages, a substrate is often used on which a wiring pattern for connection to the semiconductor chip is formed. Penetrating holes are formed in the substrate, and external electrodes are often formed so as to project through these penetrating holes from the surface opposite to that of the wiring pattern.

With a semiconductor device to which a package of this construction is applied, after mounting on the circuit board, because of the difference in coefficient of thermal expansion between the circuit board and semiconductor device, a stress may be applied to the external electrodes, and cracks may form in the external electrodes.

SUMMARY OF THE INVENTION

The present invention solves these problems, and has as its object the provision of a semiconductor device and method of manufacture thereof, a circuit board, and an electronic instrument such that cracks in the external electrodes can be prevented.

(1) According to a first aspect of the present invention, there is provided a semiconductor device comprising:

a substrate in which penetrating holes are formed;

a semiconductor chip having electrodes;

a conductive member adhered on one side of the substrate by an adhesive material over a particular region of the one side including the penetrating holes, and electrically connected to the electrodes of the semiconductor chip on the side opposite to the surface of being adhered by the adhesive; and external electrodes which are provided through the penetrating holes, electrically connected to the conductive member, and extending as far as outside of the other side of the substrate;

wherein a part of the adhesive material is interposed between internal wall surfaces forming the penetrating holes and the external electrodes within the penetrating holes.

According to the present invention, external electrodes are formed within penetrating holes, and between the external electrodes and penetrating holes part of an adhesive material is interposed. Therefore, since the adhesive material forms a stress absorption material, stress caused by differences in the coefficient of thermal expansion with the circuit board (thermal stress) and mechanical stress applied to the circuit board from the outside can be absorbed. In this way, the occurrence of cracks in the external electrodes can be prevented.

It should be noted that in the present invention, the adhesive material may be continuous from between the substrate and conductive member to the internal wall surfaces of the penetrating holes, or may exist discontinuously within the penetrating holes.

(2) In this semiconductor device, a part of the adhesive material may enter and exist within the penetrating holes.

(3) According to a second aspect of the present invention, there is provided a semiconductor device comprising:

a substrate in which penetrating holes are formed;

a semiconductor chip having electrodes;

a conductive member directly formed over a particular region including the penetrating holes on one side of the substrate, and electrically connected to the electrodes of the semiconductor chip; and external electrodes which are provided through the penetrating holes, electrically connected to the conductive member, and extending as far as outside of the other side of the substrate;

wherein the substrate is formed of a material of a higher elasticity than the external electrodes; and wherein protrusions are formed in the internal wall surfaces of the penetrating holes by the material constituting the substrate.

According to the present invention, since protrusions are formed in the internal wall surfaces of the penetrating holes, deformation is easier than with flat internal wall surfaces. Therefore, stress caused by differences in the coefficient of thermal expansion with the circuit board (thermal stress) and mechanical stress applied to the circuit board from the outside can be absorbed. In this way, the occurrence of cracks in the external electrodes can be prevented.

(4) Each of the external electrodes may include a base portion positioned within each of the penetrating holes and a projecting portion projecting from each of the penetrating holes, the diameter d of the base portion being related to the diameter $\phi$ of the projecting portion by $\phi \leq d$.

By this means, the diameter of the external electrode is not squeezed by the penetrating hole, and no necking occurs. Therefore, stress caused by differences in the coefficient of thermal expansion with the circuit board (thermal stress) and mechanical stress applied from outside the circuit board is not concentrated, and the occurrence of cracks in the external electrodes can be prevented.

(5) According to a third aspect of the present invention, there is provided a semiconductor device comprising:

a substrate in which penetrating holes are formed;

a semiconductor chip having electrodes;

a conductive member adhered on one side of the substrate by an adhesive material over a particular region of the one side including the penetrating holes, and electrically connected to the electrodes of the semiconductor chip on the side opposite to the surface of being adhered by the adhesive; and external electrodes which are provided through the penetrating holes, electrically connected to the conductive member, and extending as far as outside of the other side of the substrate;

wherein each of the external electrodes includes a base portion positioned within each of the penetrating holes and a projecting portion projecting from each of the penetrating holes, the diameter d of the base portion being related to the diameter $\phi$ of the projecting portion by $\phi \leq d$.

According to the present invention, external electrodes are formed within penetrating holes. The diameter d of the base portion of the external electrodes is related to the diameter φ of the projecting portion by $\phi \leq d$. In other words, the diameter of the external electrodes is not squeezed by the penetrating holes, and no necking occurs. Therefore, stress caused by differences in the coefficient of thermal expansion with the circuit board (thermal stress) and mechanical stress applied from outside the circuit board is not concentrated, and the occurrence of cracks in the external electrodes can be prevented.

(6) The substrate may be an insulating substrate.

(7) The substrate may be a printed substrate.

(8) The external electrodes may be formed of solder.

(9) The outline form of the substrate may be larger than the semiconductor chip outline form.

(10) The electrodes of the semiconductor chip may be electrically connected to the conductive member through an anisotropic conductive material having conductive particles dispersed in an adhesive.

(11) The electrodes of the semiconductor chip may be electrically connected to the conductive member through wires.

(12) According to a fourth aspect of the present invention, there is provided a circuit board on which the above described semiconductor device is mounted.

(13) According to a fifth aspect of the present invention, there is provided an electronic instrument having the above described circuit board.

(14) According to a sixth aspect of the present invention, there is provided a method of manufacturing a semiconductor device, comprising:

a step of providing a substrate with an adhesive material provided on one surface thereof;

a step of carrying out punching from the side of the substrate on which the adhesive material is provided, and in the direction of the opposite side thereof, whereby penetrating holes are formed and a part of the adhesive material is drawn into the penetrating holes;

a step of adhering a conductive member over a particular region on the one surface including the penetrating holes on the substrate through the adhesive material;

a step of providing a material for forming external electrodes on the conductive member, and forming external electrodes through the penetrating holes and the inner side of the part of adhesive material drawn into the penetrating holes to project from the surface opposite to the surface of the substrate on which the conductive member is formed; and a step of electrically connecting electrodes of a semiconductor chip to the conductive member.

According to the present invention, when the substrate is punched and the penetrating holes are formed, at the same time part of the adhesive material can be drawn into the penetrating holes. When the external electrodes are formed through the penetrating holes, this part of the adhesive material is interposed between the external electrodes and penetrating holes. With the thus obtained semiconductor device, the adhesive material acts as a stress absorption material, and therefore stress caused by differences in the coefficient of thermal expansion with the circuit board (thermal stress) and mechanical stress applied from outside the circuit board is absorbed, and the occurrence of cracks in the external electrodes can be prevented.

(15) According to a seventh aspect of the present invention, there is provided a method of manufacturing a semiconductor device, comprising:

a step of providing a substrate of a material of a higher elasticity than external electrodes, having penetrating holes in which the internal wall surfaces have protrusions, and having a conductive member directly formed over a region including the penetrating holes;

a step of providing a material for forming external electrodes on the conductive member, and forming external electrodes through the penetrating holes to project from the surface opposite to the surface of the substrate on which the conductive member is formed; and a step of electrically connecting electrodes of a semiconductor chip to the conductive member.

According to the present invention, since protrusions are formed in the internal wall surfaces of the penetrating holes, deformation is easier than with flat internal wall surfaces. Therefore stress caused by differences in the coefficient of thermal expansion with the circuit board (thermal stress) and mechanical stress applied to the circuit board from the outside can be absorbed. In this way, the occurrence of cracks in the external electrodes can be prevented.

(16) The method of manufacturing the semiconductor device may further comprise a step of punching the substrate before the conductive member is formed, wherein a part of the substrate is drawn into the penetrating holes and the protrusions are formed.

By this means, in the step of punching, the protrusions can be formed simply.

(17) In this method of manufacture, the penetrating holes may be formed by a laser.

When a laser is used, the protrusions occur naturally.

(18) In this method of manufacture, the penetrating holes may be formed by wet etching.

When wet etching is applied, the protrusions occur naturally.

(19) In this method of manufacture, wherein each of the external electrodes includes a base portion positioned within each of the penetrating holes and a projecting portion projecting from each of the penetrating holes, the diameter d of the base portion being related to the diameter φ of the projecting portion by $\phi \leq d$.

By this means, the diameter of the external electrodes is not squeezed by the penetrating holes, and no necking occurs. Therefore, stress caused by differences in the coefficient of thermal expansion with the circuit board (thermal stress) and mechanical stress applied from outside the circuit board is not concentrated, and the occurrence of cracks in the external electrodes can be prevented.

(20) According to an eighth aspect of the present invention, there is provided a method of manufacturing a semiconductor device, comprising:

a step of providing a substrate in which penetrating holes are formed and a conductive member is formed over a region including the penetrating holes;

a step of providing a material for forming external electrodes on the conductive member, and forming external electrodes through the penetrating holes to project from the surface opposite to the surface of the substrate on which the conductive member is formed; and a step of electrically connecting electrodes of a semiconductor chip to the conductive member;

wherein each of the external electrodes includes a base portion positioned within each of the penetrating holes and a projecting portion projecting from each of the penetrating holes, the diameter d of the base portion being related to the diameter φ of the projecting portion by $\phi \leq d$.

With a semiconductor device fabricated according to the present invention, the diameter d of the base portion of the external electrodes is related to the diameter φ of the projecting portion by φ≦d. In other words, the diameter of the external electrodes is not squeezed by the penetrating holes, and no necking occurs. Therefore, stress caused by differences in the coefficient of thermal expansion with the circuit board (thermal stress) and mechanical stress applied from outside the circuit board is not concentrated, and as a result the occurrence of cracks in the external electrodes can be prevented.

(21) The substrate may be either of an insulating film and a printed substrate.

(22) The material for forming external electrodes may be solder.

(23) The method of manufacturing a semiconductor device may further comprise a step of punching the substrate around the semiconductor chip, after the step of electrically connecting electrodes of the semiconductor chip to the conductive member.

(24) In the step of electrically connecting the electrodes of the semiconductor chip to the conductive member, the electrodes may be connected to the conductive member through an anisotropic conductive material having conductive particles dispersed in an adhesive.

(25) In the step of electrically connecting the electrodes of the semiconductor chip to the conductive member, the electrodes may be connected to the conductive member through wires.

DESCRIPTION OF PREFERRED EMBODIMENTS

The present invention is now described in terms of a number of preferred embodiments, with reference to the drawings.

First Embodiment

Figure 1A:
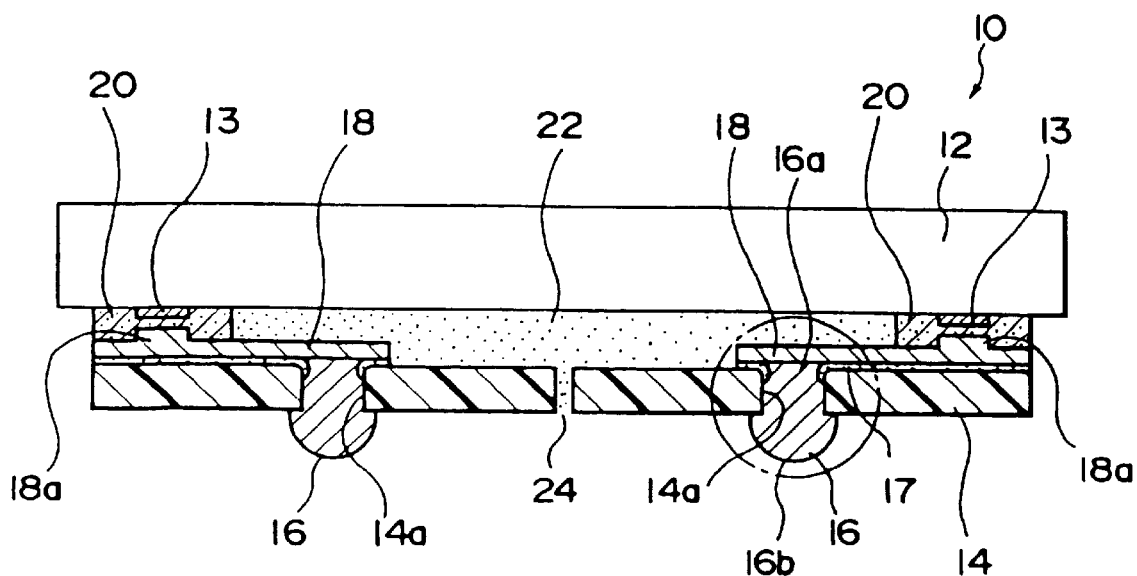
FIG. 1(A) is a cross-sectional view of a first embodiment of the semiconductor device.

FIG. 1(A) shows a first embodiment of the semiconductor device. A semiconductor device 10 comprises a semiconductor chip 12, being an example of a semiconductor chip, and an insulating film 14, being an example of a substrate, to which the CSP type of package is applied. On the insulating film 14 are formed external electrodes 16, and the semiconductor chip 12 has a plurality of electrodes 13. In FIG. 1(A), the electrodes 13 are formed on only two opposite sides of the semiconductor chip 12, but as is well known, may equally be formed on four sides.

The insulating film 14 is formed of a polyimide resin or the like, and has a plurality of penetrating holes 14a. As the substrate formed of polyimide resin may be used one such that for example:

Coefficient of thermal expansion =12 ppm/° C.

Modulus of elasticity =900 kg/mm$^2$

Or one such that:

Coefficient of thermal expansion =20 ppm/° C.

Modulus of elasticity =302 kg/mm$^2$

To one surface of the insulating film 14 is adhered a wiring pattern 18, being an example of a conductive element. In more detail, the wiring pattern 18 is adhered to the insulating film 14 by an adhesive 17. As the adhesive 17, being an example of an adhesive material may be used one such that:

Coefficient of thermal expansion (50 to 150° C.)=70 to 165 ppm/° C.

Modulus of elasticity (150° C.)=0.1 to 0.9×10$^8$ Pa

Elongation after fracture=13 to 29%

And may be used one such that for example:

Coefficient of thermal expansion (50 to 150° C.)=70 ppm/° C.

Modulus of elasticity (150° C.)=0.1×10$^8$ Pa

Elongation after fracture 21%

A part of the adhesive 17 enters the penetrating holes 14a. It should be noted that in place of the adhesive 17 may be used an adhesive tape or the like. The wiring pattern 18 is formed so as to pass over the penetrating holes 14a, and although not shown in FIG. 1(A), the portions including the position over the penetrating holes 14a are lands of greater width than other portions.

Further, in the insulating film 14 external electrodes 16 are formed, through the penetrating holes 14a, on the wiring pattern 18 (below in the figure). The external electrodes 16 include base portions 16a bonded to the wiring pattern 18 at positions within the penetrating holes 14a, and projecting portions 16b projecting from the insulating film 14 on the opposite side to the wiring pattern 18. It should be noted that external electrodes 16 are formed of solder, copper, nickel, or the like.

Figure 1B:
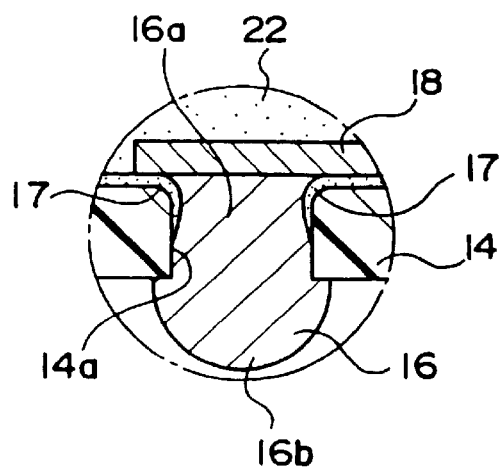
FIG. 1(B) is an enlarged view of the encircled portion of FIG. 1(A).

In this embodiment, as shown in enlargement in FIG. 1(B), a part of the adhesive 17 is interposed between the base portions 16a of the external electrodes 16 and the penetrating holes 14a. By means of this part of the adhesive 17, stress (thermal stress or mechanical stress) applied to the external electrodes 16 is absorbed. The stress often occurs when heat is applied, and therefore the adhesive 17 is required to have a degree of flexibility and elasticity at least when heat is applied such as to function to absorb the stress.

On each part of the wiring pattern 18 is formed a projection 18a. The projections 18a are formed to correspond to the electrodes 13 of the semiconductor chip 12. As a result, if the electrodes 13 are arranged on the four sides of the periphery of the semiconductor chip 12, the projections 18a will also be arranged along the four sides. The electrodes 13 are electrically connected to the projections 18a, and through the wiring pattern 18 are conductively connected to the external electrodes 16. By the formation of the projections 18a, a wide gap can be formed between the insulating film 14 and the semiconductor chip 12 or between the wiring pattern 18 and the semiconductor chip 12.

The electrical connection of the electrode 13 and projection 18a is achieved by means of an anisotropic conductive film 20 being an example of an anisotropic conductive material. The anisotropic conductive film 20 comprises conductive particles such as metal fine particles dispersed in a resin in sheet form. When the anisotropic conductive film 20 is compressed between the electrodes 13 and projections 18a, the conductive particles are also compressed, forming electrical connection between the two. When the anisotropic conductive film 20 is used, the conductive particles conduct electricity only in the direction in which they are compressed, and do not conduct electricity in other directions. As a result, even when the sheet-form anisotropic conductive film 20 is adhered on the plurality of electrodes 13, there is no electrical connection between adjacent of the electrodes 13.

In the above described example, the projections 18a are formed on the wiring pattern 18, but equally, bumps maybe formed on the electrodes 13 of the semiconductor chip 12, and in this case, the projections 18a do not need to be formed on the wiring pattern 18.

In this embodiment, the anisotropic conductive film 20 is formed only between the electrodes 13 and projections 18a and in the vicinity thereof, but it may equally be formed only between the electrodes 13 and projections 18a, or may be formed over the whole surface of the semiconductor chip 12, including the region in which a resin 22 described below is injected.

In the gap formed between the insulating film 14 and the semiconductor chip 12, a resin 22 is injected from a gel injection aperture 24. It should be noted that when the anisotropic conductive film 20 is formed over the whole surface of the semiconductor chip 12 the injection aperture 24 is not necessary, and moreover the step of injecting the resin 22 is not required.

If as the resin 22 is used a material with a low Young's modulus and an ability to absorb stress, then in addition to the stress absorption function of the adhesive 17, further stress absorption can be achieved. For example, by using polyimide resin, silicone resin, silicone denatured polyimide resin, epoxy resin, silicone denatured epoxy resin, acrylic resin, and so forth, the resin 22 provides a stress absorption unction.

Next, the principal steps in the method of manufacturing the present embodiment of the semiconductor device 10 are described.

Figure 2A:
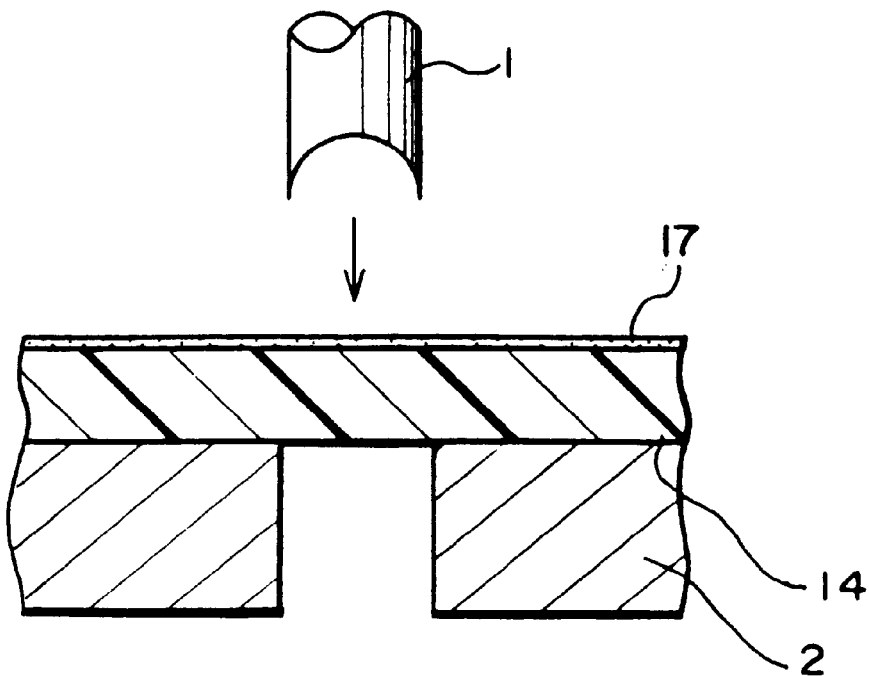
FIGS. 2A and 2B show the method of manufacturing the first embodiment of the semiconductor device.
Figure 2B:
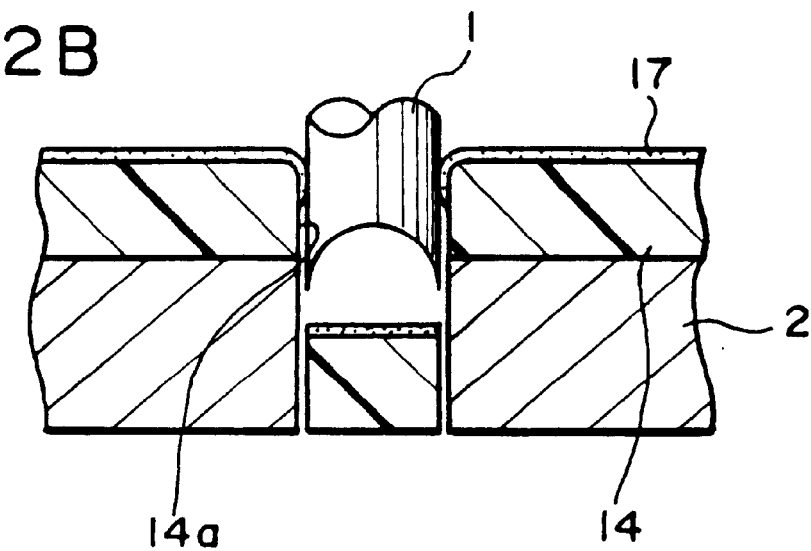

First, the insulating film 14 with the adhesive 17 provided on one surface is taken, and penetrating holes 14a are formed in the insulating film 14. This step is shown in FIGS. 2A and 2B. More specifically, as shown in FIG. 2A, first, a punch 1 and a die 2 are disposed on the side on which the adhesive 17. In this figure, the insulating film 14 is positioned with the surface having the adhesive 17 uppermost, and the punch 1 is positioned above. It should be noted that the insulating film 14 is mounted on a support not shown in the figure. Then as shown in FIG. 2B, the insulating film 14 is penetrated by the punch 1, and penetrating holes 14a are formed. The punch 1 is guided by the die 2, and drags in the adhesive 17 as it penetrates the insulating film 14. As a result, part of the adhesive 17 is drawn into the interior of the penetrating holes 14a. The adhesive 17 drawn into the penetrating holes 14a does not return when the punch 1 is withdrawn, but remains within the penetrating holes 14a. It should be noted that in order for the adhesive 17 to be drawn into the penetrating holes 14a, it is preferable for there to be a clearance of the order of 10 to 50 $\mu$m between the punch 1 and die 2.

Preferably, at the same time that the penetrating holes 14a are formed, a gel injection aperture 24 is also formed in the insulating film 14.

Then a conductive film such as a copper foil is adhered to the insulating film 14, and by etching the wiring pattern 18 is formed. By masking the region of formation of the projections 18a and etching so that other portions are made thin, when the mask is removed, the projections 18a can be formed.

Next, the anisotropic conductive film 20 is adhered on the insulating film 14 over the projections 18a. In more detail, when the plurality of projections 18a are arranged along two opposing sides, the anisotropic conductive film 20 is adhered in two parallel strips, and when the projections 18a are arranged along four sides, the anisotropic conductive film 20 is adhered so as to describe a corresponding rectangle.

In this way, the above described insulating film 14 is pressed onto the semiconductor chip 12 such that the projections 18a and electrodes 13 correspond, and the anisotropic conductive film 20 is compressed by the projections 18a and electrodes 13. In this way, electrical connection of the projections 18a and electrodes 13 can be achieved.

Next, resin is injected from the gel injection aperture 24, and the resin 22 is formed between the insulating film 14 and the semiconductor chip 12.

Then through the penetrating holes 14a, solder is disposed on the wiring pattern 18, and ball-shaped external electrodes 16 are formed. More specifically, for example, a solder paste is used to print the solder, or solder balls are disposed on the wiring pattern 18 so that the external electrodes 16 are formed.

By means of these processes, the semiconductor device 10 can be obtained. It should be noted that in this embodiment, the anisotropic conductive film 20 is used, but in place of this an anisotropic conductive adhesive may be used. Except for the fact that the anisotropic conductive adhesive is not in sheet form, it has the same construction as the anisotropic conductive film 20.

According to this embodiment, since the adhesive 17 is present between the external electrodes 16 and penetrating holes 14a formed in the insulating film 14, stress (thermal stress or mechanical stress) applied to the external electrodes 16 can be absorbed. In order to obtain such a construction, as described above, the adhesive 17 is provided beforehand on the insulating film 14, and a step is carried out of punching the penetrating holes 14a from the side of the adhesive 17. By this means, simultaneous with the punching of the penetrating holes 14a, part of the adhesive 17 can be drawn into the penetrating holes 14a.

Figure 3:
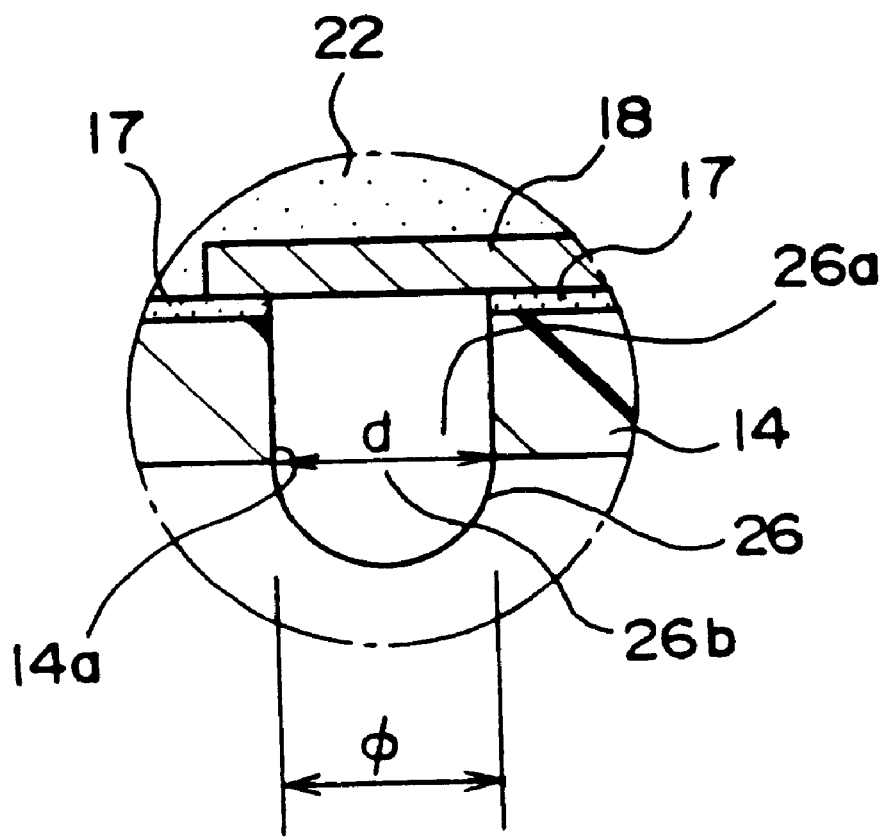
FIG. 3 shows a modification of the first embodiment of the semiconductor device.

FIG. 3 shows a modification of this embodiment. In this modification, the adhesive 17 does not enter the penetrating holes 14a in the insulating film 14, and the external electrodes 26 have a particular form. Since it is not necessary for the adhesive 17 to enter the penetrating holes 14a, a printed circuit board not having the adhesive 17 can be used in place of the insulating film 14.

In this case, the diameter d of the base portion 26a of the external electrode 26 and the diameter $\phi$ of the projecting portion 26b are such that the relation $\phi \leq d$ holds. In other words, the base portion 26a positioned in the extremity of the openings of the penetrating holes 14a is approximately equal to the projecting portion 26b projecting from the insulating film 14 on the periphery of the penetrating hole 14a, or alternatively the base portion 26a is larger than the projecting portion 26b. In particular, it is preferable that the two are approximately equal. In this way, going from the projecting portion 26b to the base portion 26a a necked form is prevented from being formed.

According to this construction, since the external electrodes 26 do not have a necked form, stress applied to the external electrodes 26 is not concentrated. Moreover, the stress is distributed, and cracks can be prevented. It should be noted that if the construction in which the adhesive 17 enters the penetrating holes 14a is adopted, the stress absorption capability is further enhanced.

The method of manufacture is the same as in the above described embodiment. However, since a step of causing the adhesive 17 to enter the penetrating holes 14a is not necessarily required, the direction of punching the penetrating holes 14a is not restricted. For example, by forming the wiring pattern 18 on the insulating film 14 by sputtering, the adhesive 17 may be omitted in this modification. However, it is not the case that the adhesive 17 is prevented from being present between the penetrating holes 14a and the external electrodes 26.

Second Embodiment

Figure 4:
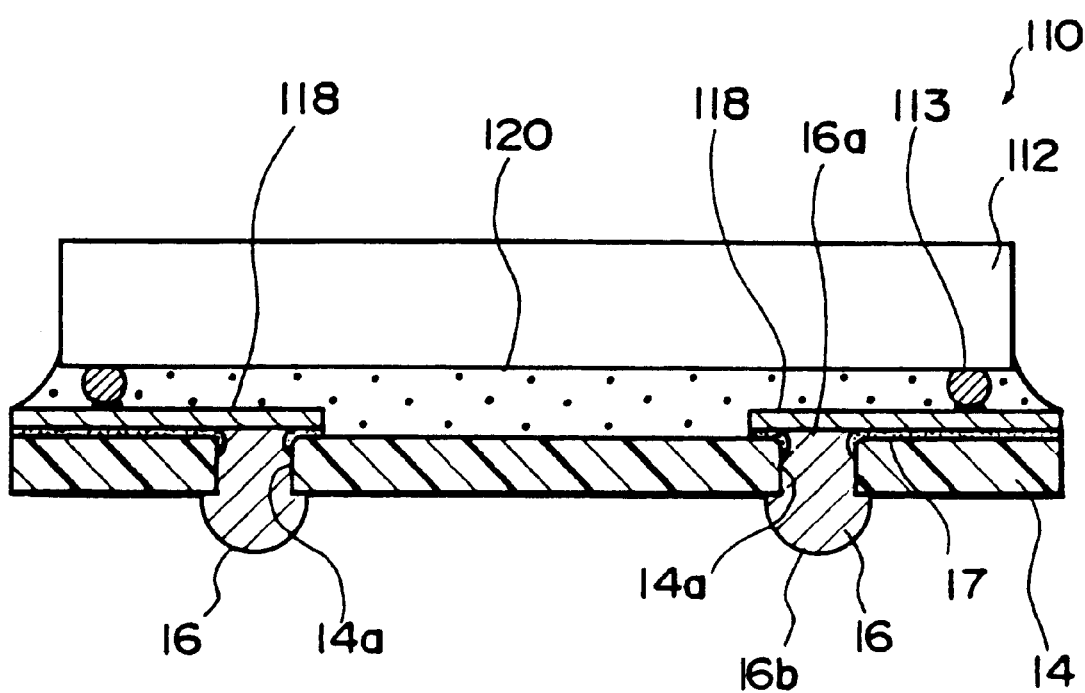
FIG. 4 is a cross-sectional view of a second embodiment of the semiconductor device.

FIG. 4 shows a second embodiment of the semiconductor device. This semiconductor device 110 includes a semiconductor chip 112, an insulating film 14 being an example of a substrate (the same construction as the first embodiment), and a plurality of external electrodes 16 (the same construction as the first embodiment). Bumps 113 are provided on a plurality of electrodes (not shown in the drawing) of the semiconductor chip 112. The bumps 113 are commonly gold ball bumps or gold plating bumps, but may equally be solder balls. The insulating film 14 is formed to be larger than the semiconductor chip 112.

On one surface of the insulating film 14 is adhered a conductive member 118. The conductive member 118 is formed as the wiring pattern 18 shown in FIG. 1 with the projections 18a omitted, and is attached to the insulating film 14 with an adhesive 17.

The electrical connection of the bumps 113 and conductive member 118 is achieved by an anisotropic conductive material 120 provided over the whole surface of the side of the insulating film 14 on which is formed the conductive member 118. As the anisotropic conductive material 120 can be used the same material as the anisotropic conductive film 20 shown in FIG. 1. By this means, the anisotropic conductive material 120 is interposed between the semiconductor chip 112 and the insulating film 14, and the surface of the semiconductor chip 112 on which electrodes are formed, and the surface of the insulating film 14 on which the conductive member 118 are formed are covered and protected. Other construction is the same as in the first embodiment.

For the method of manufacturing the present embodiment of the semiconductor device 110, the same method as described for the first embodiment can be applied, except for the provision of the anisotropic conductive material 120 over the whole surface of the insulating film 14. When fabricating the semiconductor device 110, the semiconductor chip 112 may be mounted on a substrate, and then this substrate stamped out in the form of the insulating film 14. In this embodiment also, for the form of the external electrodes 16, the form shown in FIG. 3 can be applied.

Third Embodiment

Figure 5:
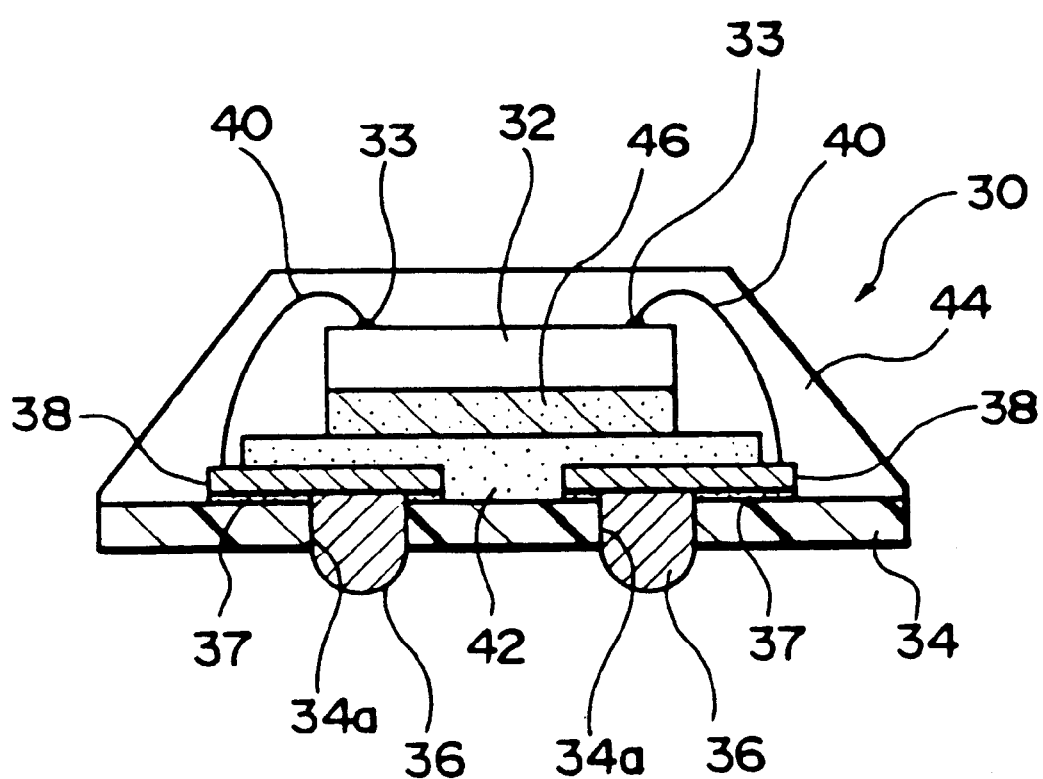
FIG. 5 shows a third embodiment of the semiconductor device.

FIG. 5 shows a third embodiment of the semiconductor device of the present invention. The semiconductor device 30 shown in this figure has a wiring pattern 38 and electrodes 33 of a semiconductor chip 32 connected by wires 40. The wiring pattern 38 is formed by adhesion to a substrate 34 with an adhesive 37 interposed. The substrate 34 may be an insulating film in the same way as in the first embodiment, or a printed circuit board.

On the surface of the substrate 34 on which the wiring pattern 38 is formed, a stress relieving layer 42 is provided. The stress relieving layer 42 is formed of a material such as may be selected as the resin 22 in the first embodiment. The stress relieving layer 42 is affixed by means of an adhesive 46 to the surface opposite to the surface having the electrodes 33 of the semiconductor chip 32.

In the substrate 34 are formed penetrating holes 34a. Through these penetrating holes 34a, external electrodes 36 are formed on the wiring pattern 38. In more detail, the external electrodes 36 are formed on the wiring pattern 38 so as to project from the opposite surface of the substrate 34 from the wiring pattern 38. Then the periphery of the semiconductor chip 32 and the surface of the substrate 34 having the wiring pattern 38 are sealed with a resin 44.

The external electrodes 36 have the same construction as that shown in FIG. 1 or that of the external electrodes 26 shown in FIG. 3, and the same effect can be achieved. Alternatively, in the same way as the embodiment shown in FIG. 1, the adhesive 37 may be interposed between the penetrating holes 34a and the external electrodes 36.

This embodiment differs from the first embodiment in that the wires 40 are used to connect the electrodes 33 of the semiconductor chip 32 and the wiring pattern 38, and in that the semiconductor chip 32 and so forth is sealed with the resin 44, but in relation to the stress absorption function, is the same as the first embodiment.

Fourth Embodiment

Figure 6:
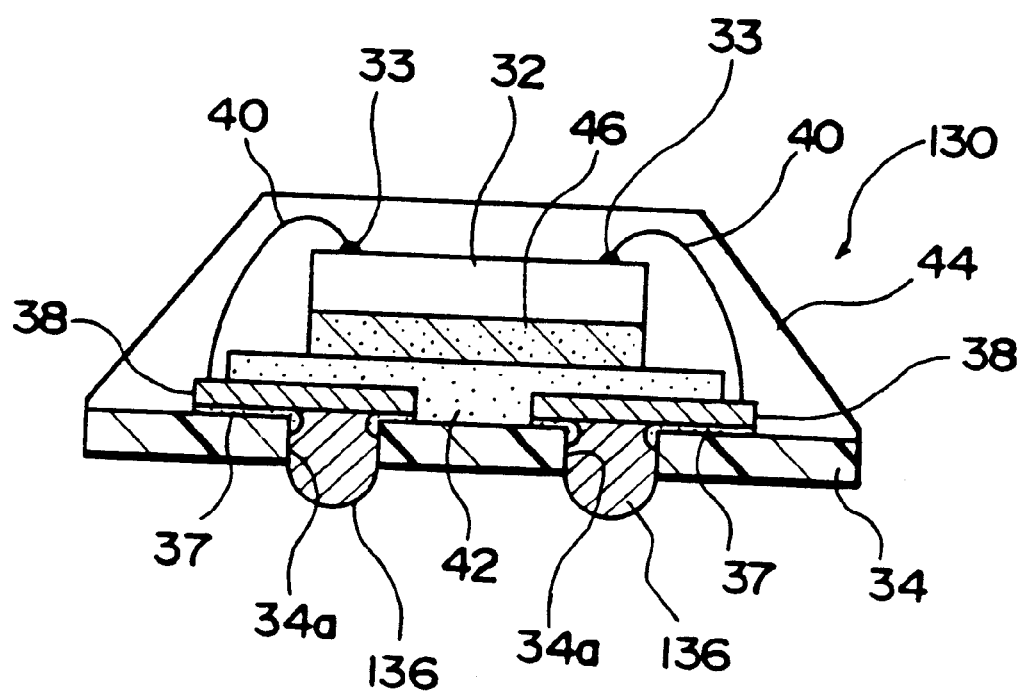
FIG. 6 shows a fourth embodiment of the semiconductor device.

FIG. 6 shows a fourth embodiment of the semiconductor device of the present invention. A semiconductor device 130 shown in this figure differs from the semiconductor device 30 shown in FIG. 5 in that the adhesive 37 is present between the penetrating holes 34a and external electrodes 136.

Fifth Embodiment

Figure 7:
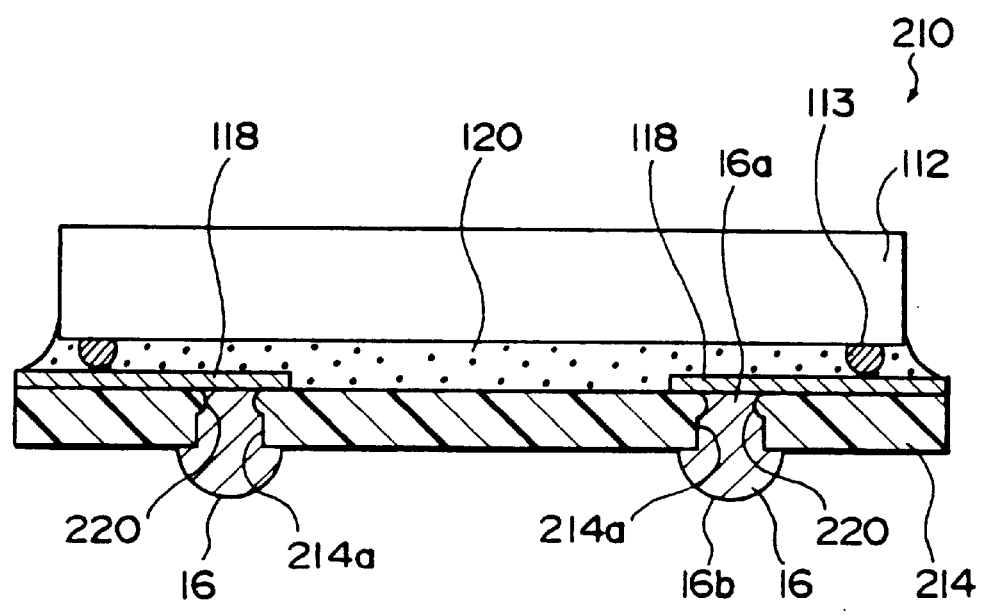
FIG. 7 is a cross-sectional view of a fifth embodiment of the semiconductor device.

FIG. 7 shows a fifth embodiment of the semiconductor device of the present invention. A semiconductor device 210 shown in this figure differs from the semiconductor device 110 shown in FIG. 4 in that the conductive member 118 is directly formed on a substrate 214 without an adhesive material. In FIG. 7, components same as in the semiconductor device 110 shown in FIG. 4 have the same reference numerals. It should be noted that in this embodiment, the semiconductor chip 112 is subjected to face-down mounting, but the face-up mounting shown in FIG. 6 may equally be applied.

Figure 8:
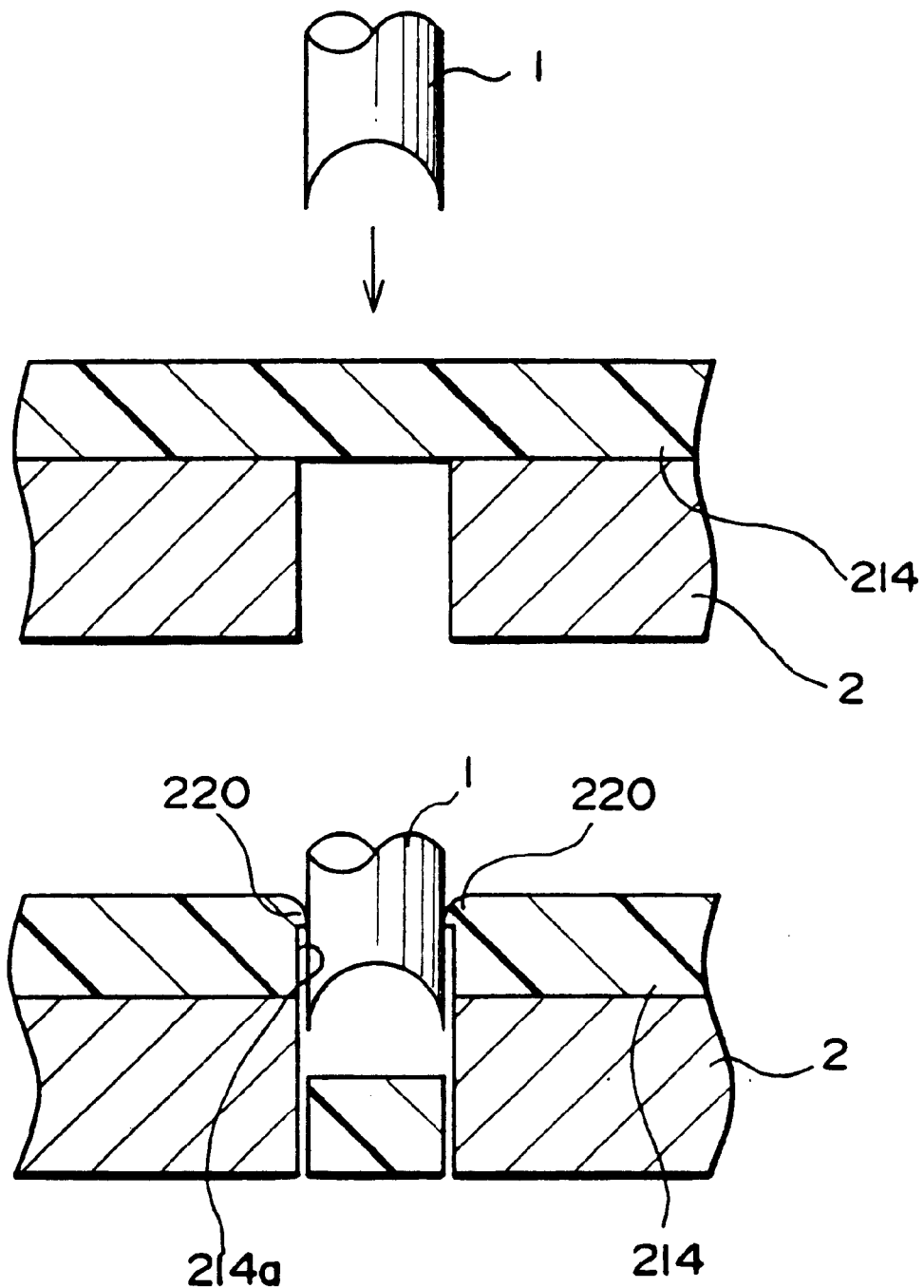
FIGS. 8A and 8B show the method of manufacturing the fifth embodiment of the semiconductor device.

The substrate 214 is formed of a material with a higher elasticity than the external electrodes 16. On the internal walls of penetrating holes 214a of the substrate 214 are formed protrusions 220. The method of forming the protrusions 220 is shown in FIGS. 8A and 8B.

The substrate 214 differs from the insulating film 14 shown in FIG. 2 in that no adhesive is provided. As shown in FIG. 8A, the substrate 214 mounted on the die 2 has the penetrating holes 214a formed by the punch 1 as shown in FIG. 8B. By this means, the material constituting the substrate 214 is formed into protrusions 220 protruding within the penetrating holes 214a. For example, on one surface of the substrate 214 a part of the portion forming the extremities of the penetrating holes 214a may be drawn into the penetrating holes 214a to form the protrusions 220, or at an intermediate position in the thickness of the substrate 214 the protrusions 220 may be formed on the internal walls of the penetrating holes 214a. The protrusions 220 may have the entire periphery of the penetrating holes 214a formed to be protruding in a ring form within the penetrating holes 214a, or may be constituted with a part only of the periphery of the penetrating holes 214a protruding within the penetrating holes 214a. By the formation of the protrusions 220, the same effect can be achieved as of the adhesive 17 being present within the penetrating holes 14a, as shown in FIG. 4. In other words, compared with the case in which the internal walls of the penetrating holes 214a are flat, since the protrusions 220 are easily deformed, stress applied to the external electrodes 16 can be absorbed.

In this way, after the penetrating holes 214a are formed, the conductive member 118 is formed on the substrate 214, to constitute two-layer substrate. For example, if the substrate 214 is of a thermoplastic substance, it can be softened by heating, and a conductive foil adhered without the use of adhesive, and by etching thereof a conductive member 218 can be formed. Alternatively, sputtering may equally be applied.

Figure 9:
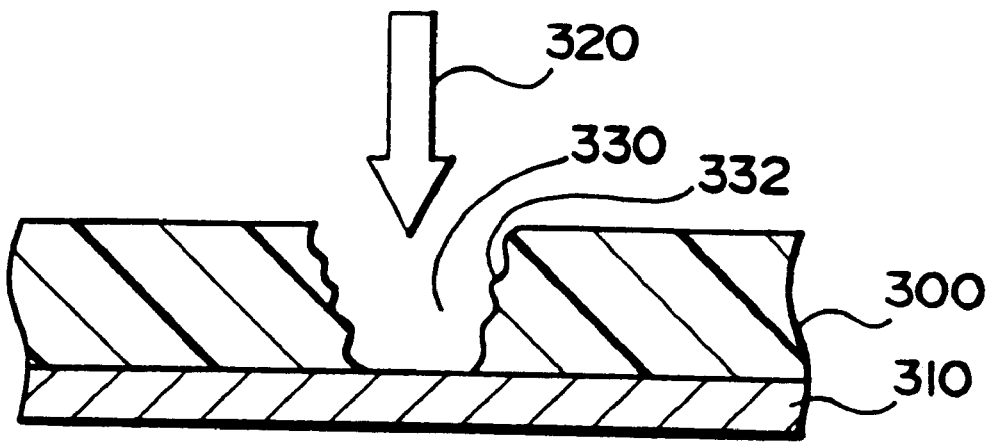
FIG. 9 shows the method of manufacturing the fifth embodiment of the semiconductor device.

Alternatively, as shown in FIG. 9, penetrating holes 330 may be formed in a substrate 300 on which a conductive member 310 is formed, using a laser 320. In this case also, in the penetrating holes 330 are formed protrusions 332. If a $CO_2$ laser is used as the laser 320 the protrusions 332 are easily formed, but an excimer laser may also be used.

Figure 10:
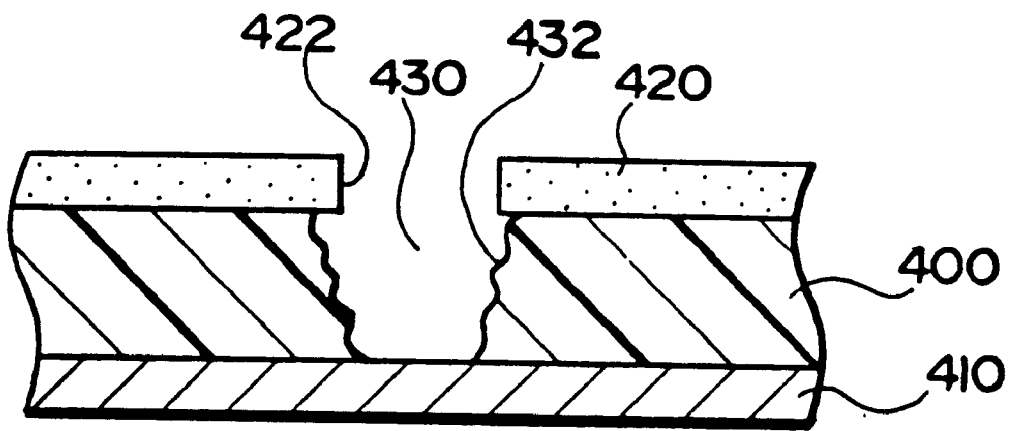
FIG. 10 shows the method of manufacturing the fifth embodiment of the semiconductor device.

As shown in FIG. 10, a resist layer 420 having openings 422 corresponding to the penetrating holes may be formed on a substrate 400 on which a conductive member 410 is formed, and by carrying out wet etching penetrating holes 430 maybe formed. In this case also, since the internal walls of the penetrating holes 430 are uneven, protrusions 432 are formed.

It should be noted that the above described embodiment is a semiconductor device to which CSP type packaging is applied, but the present invention can also be applied to a BGA type package in which a substrate larger than the semiconductor chip is used in order to achieve a higher pin count.

Figure 11:
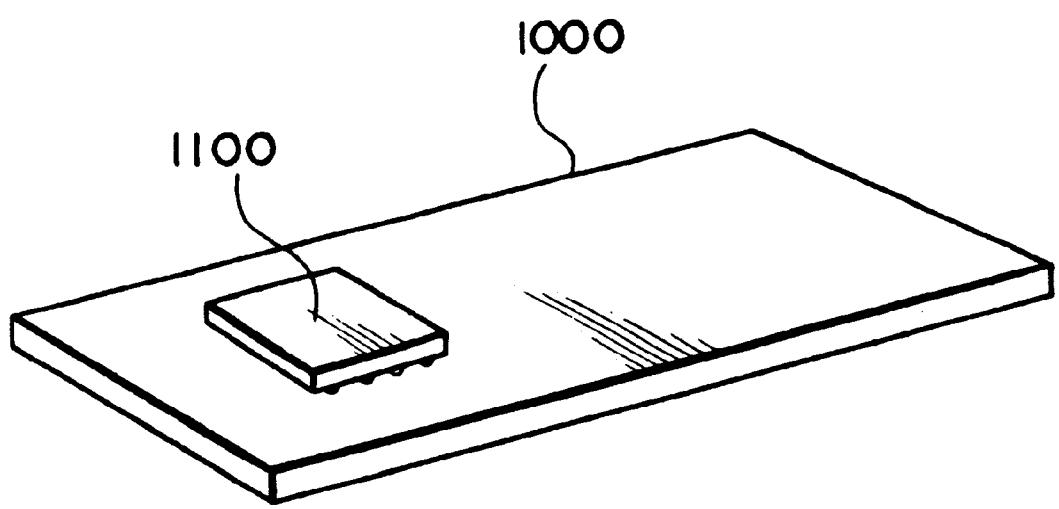
FIG. 11 shows a circuit board on which is mounted the present embodiment of a semiconductor device.

In FIG. 11 is shown a circuit board 1000 on which is mounted a semiconductor device 1100 fabricated by the method of the above described embodiment. The circuit board 1000 generally uses an organic substrate such as for example a glass epoxy substrate. On the circuit board 1000, a wiring pattern of for example copper is formed as a desired circuit, and on the circuit board 1000 are provided solder balls. Then by mechanically connecting the solder balls of the wiring pattern and the external electrodes of the semiconductor device 1100, an electrical connection between the two is achieved.

In this case, since the construction is such that strain caused in the semiconductor device 1100 by differences in thermal expansion with the surroundings and mechanical stress can be absorbed, even when this semiconductor device 1100 is mounted on the circuit board 1000, both at the time of connection and thereafter, the reliability can be improved.

It should be noted that the mounting area can be reduced to the mounting area for bare chip mounting. For this reason, when this circuit board 1000 is used in an electronic instrument, the electronic instrument itself can be made more compact. Within the same area, a larger mounting area is available, and higher functionality can also be achieved.

Figure 12:
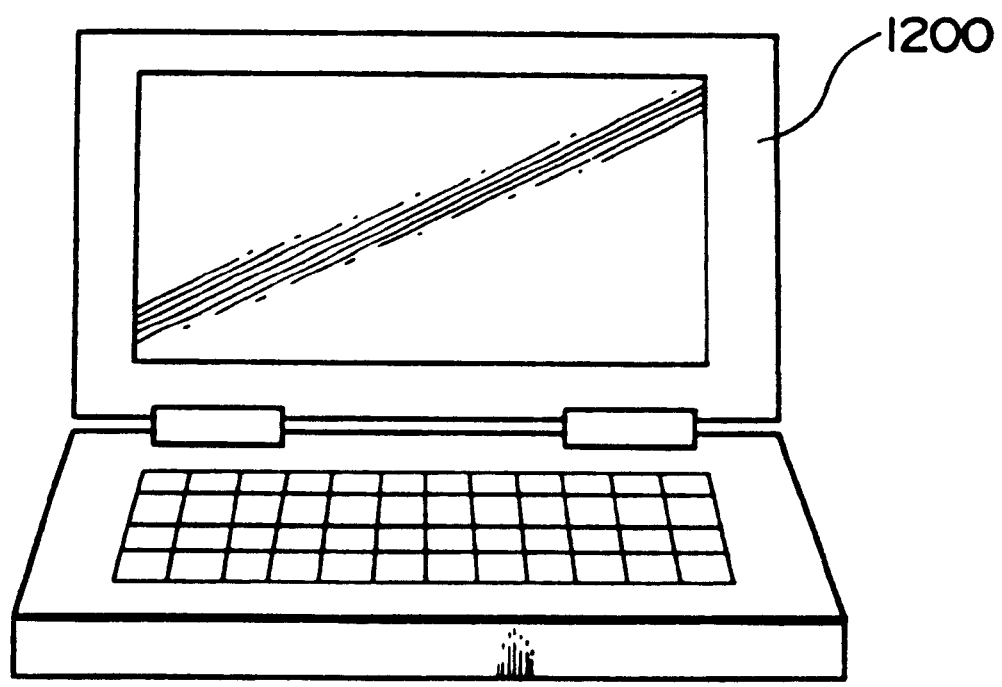
FIG. 12 shows an electronic instrument provided with a circuit board on which is mounted the present embodiment of a semiconductor device.

As an electronic instrument provided with this circuit board 1000, FIG. 12 shows a notebook personal computer 1200.

It should be noted that, the present invention can be applied to various surface-mounted electronic components, whether active or passive. Electronic components include, for example, resistors, capacitors, coils, oscillators, filters, temperature sensors, thermistors, varistors, variable resistors, and fuses.

What is claimed is:

1. A method of manufacturing a semiconductor device, comprising:

a step of providing a substrate with an adhesive material provided on one surface thereof;

a step of carrying out punching from the side of said substrate on which said adhesive material is provided, and in the direction of the opposite side thereof, whereby penetrating holes are formed and a part of said adhesive material is drawn into said penetrating holes;

a step of adhering a conductive member over a particular region on said one surface including said penetrating holes on said substrate through said adhesive material;

a step of providing a material for forming external electrodes on said conductive member, and forming external electrodes through said penetrating holes and the inner side of said part of adhesive material drawn into the penetrating holes to project from the surface opposite to the surface of said substrate on which said conductive member is formed; and a step of electrically connecting electrodes of a semiconductor chip to said conductive member.

2. The method of manufacturing a semiconductor device as defined in claim 1, wherein each of said external electrodes includes a base portion positioned within each of said penetrating holes and a projecting portion projecting from each of said penetrating holes, the diameter d of said base portion being related to the diameter $\phi$ of said projecting portion by $\phi \leq d$.

3. The method of manufacturing a semiconductor device as defined in claim 1, wherein said substrate is either of an insulating film and a printed substrate.

4. The method of manufacturing a semiconductor device as defined in claim 1, wherein said material for forming external electrodes is solder.

5. The method of manufacturing a semiconductor device as defined in claim 1, further comprising:

a step of punching said substrate around said semiconductor chip, after the step of electrically connecting electrodes of said semiconductor chip to said conductive member.

6. The method of manufacturing a semiconductor device as defined in claim 1, wherein in the step of electrically connecting said electrodes of said semiconductor chip to said conductive member, said electrodes are connected to said conductive member through an anisotropic conductive material having conductive particles dispersed in an adhesive.

7. The method of manufacturing a semiconductor device as defined in claim 1, wherein in the step of electrically connecting said electrodes of said semiconductor chip to said conductive member, said electrodes are connected to said conductive member through wires.

8. A method of manufacturing a semiconductor device, comprising:

a step of providing a substrate of a material of a higher elasticity than external electrodes, having penetrating holes in which the internal wall surfaces have protrusions, and having a conductive member directly formed over a region including said penetrating holes;

a step of providing a material for forming external electrodes on said conductive member, and forming external electrodes through said penetrating holes to project from the surface opposite to the surface of said substrate on which said conductive member is formed; and a step of electrically connecting electrodes of a semiconductor chip to said conductive member.

9. The method of manufacturing a semiconductor device as defined in claim 8, further comprising:

a step of punching said substrate before said conductive member is formed, wherein a part of said substrate is drawn into said penetrating holes and said protrusions are formed.

10. The method of manufacturing a semiconductor device as defined in claim 8, wherein said penetrating holes are formed by a laser.

11. The method of manufacturing a semiconductor device as defined in claim 8, wherein said penetrating holes are formed by wet etching.

12. The method of manufacturing a semiconductor device as defined in claim 8, wherein each of said external electrodes includes a base portion positioned within each of said penetrating holes and a projecting portion projecting from each of said penetrating holes, the diameter d of said base portion being related to the diameter $\phi$ of said projecting portion by $\phi \leqq d$.

13. The method of manufacturing a semiconductor device as defined in claim 8, wherein said substrate is either of an insulating film and a printed substrate.

14. The method of manufacturing a semiconductor device as defined in claim 8, wherein said material for forming external electrodes is solder.

15. The method of manufacturing a semiconductor device as defined in claim 8, further comprising:

a step of punching said substrate around said semiconductor chip, after the step of electrically connecting electrodes of said semiconductor chip to said conductive member.

16. The method of manufacturing a semiconductor device as defined in claim 8, wherein in the step of electrically connecting said electrodes of said semiconductor chip to said conductive member, said electrodes are connected to said conductive member through an anisotropic conductive material having conductive particles dispersed in an adhesive.

17. The method of manufacturing a semiconductor device as defined in claim 8, wherein in the step of electrically connecting said electrodes of said semiconductor chip to said conductive member, said electrodes are connected to said conductive member through wires.

18. A method of manufacturing a semiconductor device, comprising:

a step of providing a substrate in which penetrating holes are formed and a conductive member is formed over a region including said penetrating holes;

a step of providing a material for forming external electrodes on said conductive member, and forming external electrodes through said penetrating holes to project from the surface opposite to the surface of said substrate on which said conductive member is formed; and a step of electrically connecting electrodes of a semiconductor chip to said conductive member;

wherein each of said external electrodes includes a base portion positioned within each of said penetrating holes and a projecting portion projecting from each of said penetrating holes, the diameter d of said base portion being related to the diameter $\phi$ of said projecting portion by $\phi \leqq d$.

19. The method of manufacturing a semiconductor device as defined in claim 18, wherein said material for forming external electrodes is solder.

20. The method of manufacturing a semiconductor device as defined in claim 18, further comprising:

a step of punching said substrate around said semiconductor chip, after the step of electrically connecting electrodes of said semiconductor chip to said conductive member.

21. The method of manufacturing a semiconductor device as defined in claim 18, wherein in the step of electrically connecting said electrodes of said semiconductor chip to said conductive member, said electrodes are connected to said conductive member through an anisotropic conductive material having conductive particles dispersed in an adhesive.

22. The method of manufacturing a semiconductor device as defined in claim 18, wherein in the step of electrically connecting said electrodes of said semiconductor chip to said conductive member, said electrodes are connected to said conductive member through wires.

* * * * *